(12) United States Patent
Yi et al.

(10) Patent No.: US 9,799,705 B1
(45) Date of Patent: Oct. 24, 2017

(54) SEMICONDUCTOR DEVICE AND METHOD OF MAKING THE SAME

(71) Applicant: UNITED MICROELECTRONICS CORP., Hsin-Chu (TW)

(72) Inventors: Liang Yi, Singapore (SG); Chia-Ching Hsu, Yunlin County (TW); Shen-De Wang, Hsinchu County (TW); Ko-Chi Chen, Taoyuan (TW); Guoan Du, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/297,164

(22) Filed: Oct. 19, 2016

(30) Foreign Application Priority Data

Sep. 8, 2016 (TW) .............................. 105129127 A

(51) Int. Cl.
| | | |
|---|---|---|
| *H01L 45/00* | (2006.01) | |
| *H01L 27/24* | (2006.01) | |
| *H01L 21/768* | (2006.01) | |

(52) U.S. Cl.
CPC .... *H01L 27/2436* (2013.01); *H01L 21/76877* (2013.01); *H01L 45/1233* (2013.01); *H01L 45/1253* (2013.01); *H01L 45/146* (2013.01); *H01L 45/1608* (2013.01); *H01L 45/1675* (2013.01); *H01L 45/1683* (2013.01)

(58) Field of Classification Search
None
See application file for complete search history.

(56) References Cited

U.S. PATENT DOCUMENTS

| | | | |
|---|---|---|---|
| 6,507,061 B1 | 1/2003 | Hudgens | |
| 2008/0315174 A1* | 12/2008 | Kang | ............... H01L 27/115 257/4 |
| 2009/0148981 A1 | 6/2009 | Lai | |
| 2012/0305880 A1 | 12/2012 | Zhang | |
| 2013/0112935 A1* | 5/2013 | Himeno | ............. H01L 45/1253 257/4 |
| 2015/0243708 A1* | 8/2015 | Ravasio | ............. H01L 27/2463 257/4 |

FOREIGN PATENT DOCUMENTS

CN 104659050 5/2015

OTHER PUBLICATIONS

Yi, Title of Invention: Semiconductor Device and Manufacturing Method Thereof, U.S. Appl. No. 15/260,754, filed Sep. 9, 2016.

* cited by examiner

*Primary Examiner* — Cheung Lee
(74) *Attorney, Agent, or Firm* — Winston Hsu

(57) ABSTRACT

The present invention provides a semiconductor device. The semiconductor device includes a contact structure disposed in a first dielectric layer, a second dielectric layer disposed on the first dielectric layer and having an opening disposed therein, a spacer disposed in the opening and partially covering the contact structure, and a resistive random-access memory (RRAM) disposed on the contact structure and directly contacting the spacer, wherein the RRAM includes a bottom electrode, a top electrode, and a switching resistance layer disposed between the bottom electrode and the top electrode.

18 Claims, 6 Drawing Sheets

SEMICONDUCTOR DEVICE AND METHOD OF MAKING THE SAME

BACKGROUND OF THE INVENTION

1. Field of the Invention

Embodiments of the invention generally relate to a semiconductor device, and more particularly, to a resistive random access memory (hereinafter abbreviated as RRAM) structure and a manufacturing method thereof.

2. Description of the Prior Art

Resistive random access memory (RRAM) has a simple structure, low operating voltage, high-speed, good endurance, and CMOS process compatibility. RRAM is the most promising alternative to provide a downsized replacement for traditional flash memory. RRAM is finding wide application in devices such as optical disks and non-volatile memory arrays.

An RRAM cell stores data within a layer of material that can be induced to undergo a phase change. The phase change can be induced within all or part of the layer to switch between a high resistance state and a low resistance state. The resistance state can be queried and interpreted as representing either a "0" or a "1". In a typical RRAM cell, the data storage layer includes an amorphous metal oxide. Upon application of a sufficient voltage, a metallic bridge is induced to form across the data storage layer, which results in the low resistance state. The metallic bridge can be disrupted and the high resistance state restored by applying a short high current density pulse that melts or otherwise breaks down all or part of the metallic structure. The data storage layer quickly cools and remains in the high resistance state until the low resistance state is induced again.

SUMMARY OF THE INVENTION

The present invention provides a semiconductor device, which includes a contact structure disposed in a first dielectric layer, a second dielectric layer disposed on the first dielectric layer and comprising an opening, a spacer disposed in the opening and partially covering the contact structure, and a resistive random-access memory (RRAM) at least disposed on the contact structure and directly contacting the spacer, wherein the RRAM comprises a bottom electrode, a top electrode and a switching resistance layer disposed between the bottom electrode and the top electrode.

The present invention further provides a method for forming a semiconductor device, which includes the following steps: providing a contact structure in a first dielectric layer, forming a second dielectric layer on the first dielectric layer, performing a first etching process to form an opening in the second dielectric layer, forming a spacer in the opening to partially cover the contact structure, and forming a resistive random-access memory (RRAM) on the contact structure to directly contact the spacer.

The feature of the present invention is that the width of the RRAM and the width of the opening which are disposed on the opening are equal to the critical dimension. Therefore, the size of the device can be shrunk as much as possible. Besides, the size of the opening is further decreased since the spacers are formed in the opening, and the spacers also protect the contact structure from damages by the etching process, so as to improve the yield.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIGS. 1-7 illustrate a forming method of a semiconductor device according to a first embodiment of the present invention, wherein: FIG. 1 shows the schematic diagram of the semiconductor device, including an opening disposed on a contact structure;

FIG. 2 shows the schematic diagram of the semiconductor device after two first spacers are formed;

FIG. 3 shows the schematic diagram of the semiconductor device after a bottom electrode layer, a switching resistance layer and a top electrode layer are formed;

FIG. 4 shows the schematic diagram of the semiconductor device after a resistive random-access memory (RRAM) structure is formed;

FIG. 5 shows the schematic diagram of the semiconductor device after two second spacers are formed;

FIG. 6 shows the schematic diagram of the semiconductor device after another contact structure is formed;

FIG. 7 shows the schematic diagram of the RRAM structure electrically connected to a transistor.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

The semiconductor of the present invention, at least includes a resistive random access memory (RRAM) disposed on a contact structure. The contact structure may be disposed in an inter-metal dielectric (IMD). In the following paragraphs, in order to describe the features of the present invention simply, one contact structure is shown and disposed in an IMD. Next, a RRAM structure is then formed on the contact structure.

Figure 1:
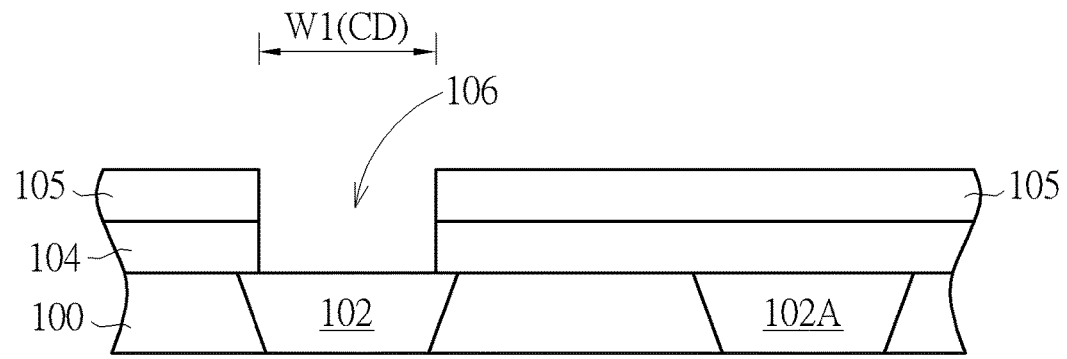

As shown in FIG. 1, a contact structure 102 is provided, disposed in an inter-metal dielectric (IMD) 100. Afterwards, an etching stop layer 104 and a hard mask (such as silicon oxide) 105 are formed on the IMD 100, and the etching stop layer 104 and the hard mask 105 are patterned to form an opening 106 shown in FIG. 1. The opening 106 exposes parts of the contact structure 102. In most embodiments, the bottom electrode of a RRAM structure formed in the following steps will be disposed in the opening 106. Besides, except for the contact structure 102, the present invention may further comprise other contact structures (such as a contact structure 102A shown in FIG. 1) in the IMD 100.

The width W1 of the opening 106 affects the shape of RRAM stacked structure formed in the following steps. It is noteworthy that, in the present invention, in order to shrink the device size as much as possible, preferably, the width W1 of the opening 106 is equal to the critical dimension (critical dimension, CD) under the current manufacturing technology. That means under the current manufacturing technology, the critical dimension is the minimum width that can be formed through a regular lithography process. For example, considering the critical dimension under the current 14 nm manufacturing process technology, the width W1 of the opening 106 is about smaller than 90 nanometers. In other words, the width W1 of the opening 106 cannot be further shrunk by adjusting the lithography process (such as shrinking the photomask's size). However, the present invention is not limited thereto, the width W1 of the opening 106 may also be larger than the critical dimension.

Figure 2:
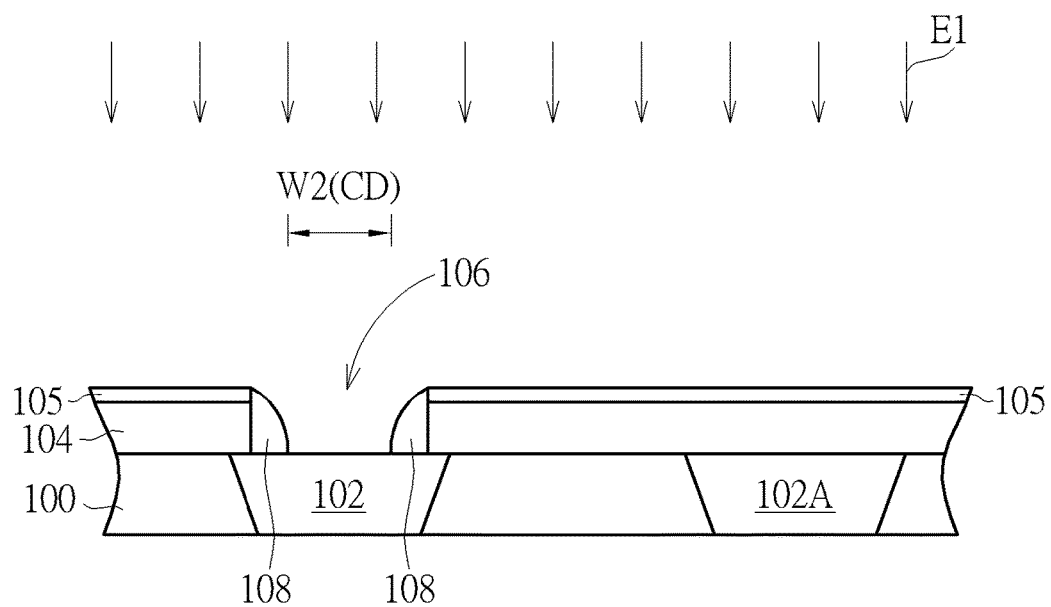

Next, as shown in FIG. 2, a spacer material layer (not shown) is deposited on the hard mask 105 and in the opening 106. An anisotropic etching process E1 is then performed to remove parts of the spacer material layer, and at least two first spacers 108 are formed on two inner sidewalls of the opening 106 respectively. The material of the spacers 108 can be any suitable spacer materials. Examples of materials suitable for spacers 108 include, without limitation, SiN, SiON and $SiO_2$. Inmost embodiments, the material of the spacers 108 is selected to allow etch selectivity between spacers 108 and the etching stop layer 104. For example, in one embodiment the etching stop layer 104 includes SiON, and the spacers 108 include SiN. In addition, during the etching process E1, the hard mask 105 may be entirely removed, and the etching stop layer 104 is therefore exposed, or as shown in FIG. 2, parts of the hard mask 105 still exists on the etching stop layer 104.

It is noteworthy that, since the first spacers 108 are formed in the opening 106, the width of the opening 106 is decreased from W1 to W2, and W2 is smaller than W1. In some embodiments, W2 is about smaller than 60 nanometers, but not limited thereto.

Figure 3:
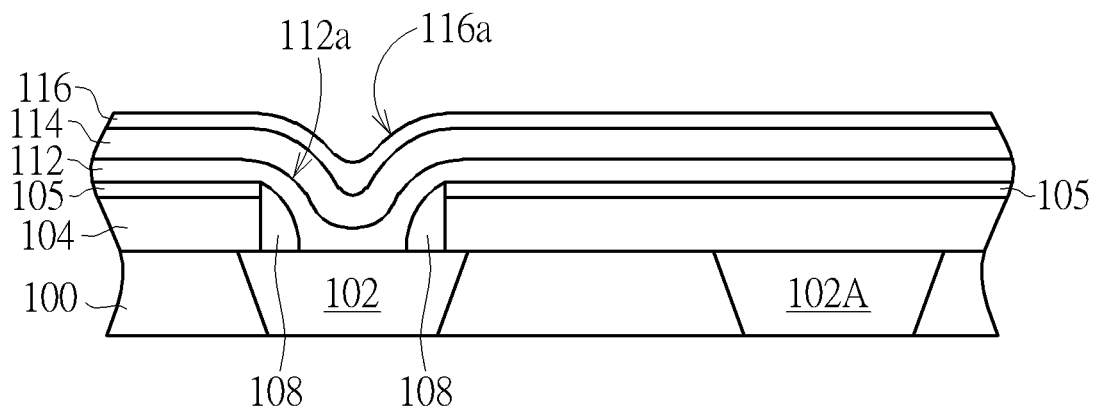

Afterwards, as shown in FIG. 3, a bottom electrode layer 112, a switching resistance layer 114 and a top electrode layer 116 are formed at least in the opening 106. In this embodiment, the bottom electrode layers 112 is substantially conformally formed on the etching stop layer 104 (or on the hard mask 105) and in the opening 106, therefore, the bottom electrode layer 112 has a concave (or recessed) top surface 112a. Next, the switching resistance layer 114 and the top electrode layer 116 are substantially and conformally formed on the bottom electrode layer 112. So the top electrode layer 116 also has a concave (or recessed) top surface 116a.

The bottom electrode layer 112 and the top electrode layer 116 can have any suitable composition and can be formed by any suitable process. Examples of suitable compositions include, without limitation, metals, metal nitrides, and doped polysilicon, or the combination thereof. In some embodiments, the bottom electrode layer 112 and the top electrode layer 116 include metals. The metal could be, for example, Al, Ti, Ta, Au, Pt, W, Ni, Ir, or Cu. In some embodiments, the bottom electrode layer 112 and the top electrode layer 116 include metal nitride. The metal nitride could be, for example, titanium nitride (TiN), tantalum nitride (TaN) or tungsten nitride (WN). In some embodiments, the bottom electrode layer 112 and the top electrode layer 116 include doped polysilicon. A doped polysilicon can be either a p+ doped polysilicon or an n+ doped polysilicon. Besides, the bottom electrode layer 112 and the top electrode layer 116 may include identical material or different materials, and the present invention is not limited thereto.

The material of the switching resistance layer 114 can be any material suitable for the data storage layer of an RRAM cell. A material suitable for the data storage layer of an RRAM cell is one that can be induced to undergo a reversible phase change between a high resistance state and a low resistance state. In some embodiments, the phase change is between an amorphous state and a metallic state. The phase change can be accompanied by or associated with a change in chemical composition. In most embodiments, the switching resistance layer 114 is a high-k dielectric while in the low resistance state. In some embodiments, the switching resistance layer 114 is a transitional metal oxide. Examples of materials that can be suitable for the switching resistance layer 114 include such as titanium oxide, nickel oxide (NiO), tungsten oxide ($WO_3$), zirconium oxide (ZrO), copper oxide (CuO), hafnium oxide (HfO), tantalum oxide (TaO), zinc oxide (ZnO), aluminum oxide ($Al_2O_3$), molybdenum oxide (MoO), but not limited thereto. In most embodiments, the thickness of the switching resistance layer 114 is in the range from 20 angstroms to 100 angstroms. In some embodiments, the thickness of the switching resistance layer 114 is in the range from 30 angstroms to 70 angstroms, for example, 50 angstroms.

In addition, before the bottom electrode layer 112 is formed, a diffusion barrier layer (not shown) can be selectively formed in the opening 106, and the bottom electrode layer 112 is then formed on the diffusion barrier layer. The diffusion barrier layer can be included to prevent contamination of the bottom electrode by a material from the contact structure 102. In some embodiments, the material of the contact structure 102 includes copper, and the bottom electrode (the bottom electrode layer 112) includes a material susceptible to contamination by copper, such as titanium nitride (TiN) or tantalum nitride (TaN). The diffusion barrier layer can have any suitable composition and can be formed by any suitable process. In most embodiments, the diffusion barrier layer is a conductive oxide, nitride, or oxynitride of a metal selected from the group consisting of Al, Mn, Co, Ti, Ta, W, Ni, Sn, and Mg. Besides, the diffusion barrier layer can have any suitable thickness. A suitable thickness is large enough to provide an effective diffusion barrier while not being so large as to cause excessive resistance. In some embodiments, the thickness of the diffusion barrier layer is in the range from 100 angstroms to 300 angstroms, but not limited thereto.

Figure 4:
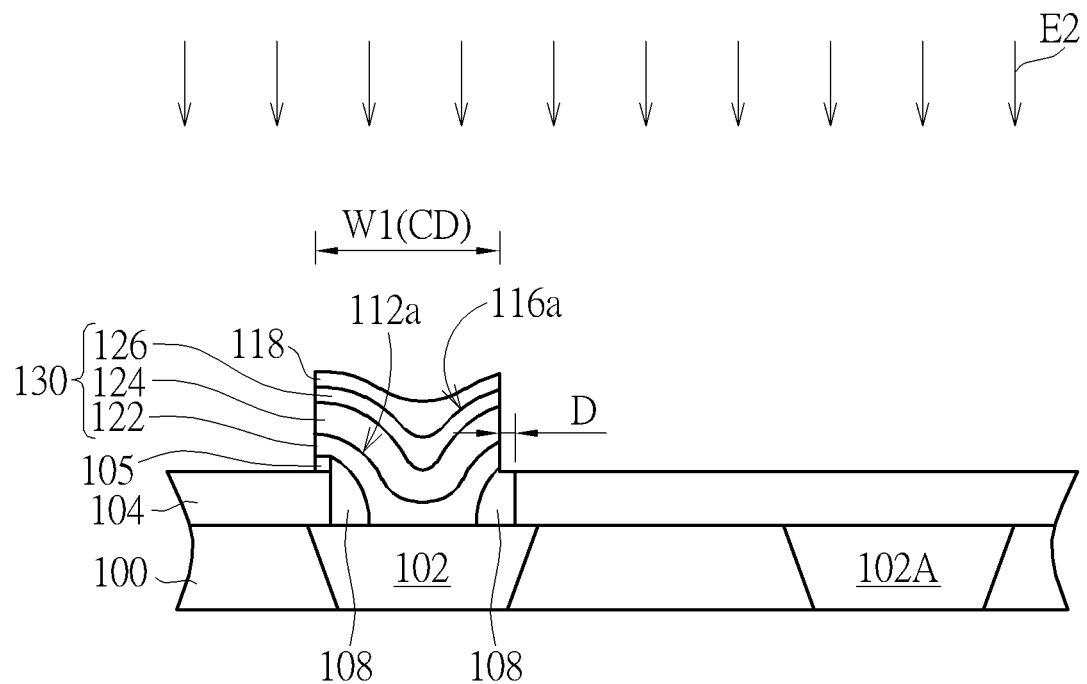

As shown in FIG. 4, a patterned hard mask 118 (such as a silicon nitride layer) is formed on the top electrode layer 116, and an etching process E2 is then performed. The patterned hard mask 118 is used as a protective layer to remove parts of the top electrode layer 116, parts of the switching resistance layer 114 and parts of the bottom electrode layer 112. After the etching process E2 is performed, the rest layer includes a bottom electrode 122, a switching resistance layer 124 and a top electrode 126, so as to form a RRAM structure 130. Besides, if the hard mask 105 mentioned above hasn't been removed yet, it may be removed completely during the etching process E2.

It is noteworthy that, in order to shrink the size of the device as much as possible, in the present invention, the size of the patterned hard mask 118 is also designed as equal to the critical dimension (CD). In other words, the width of the RRAM structure 130 is also equal to W1. It should be noticed that the critical dimension mentioned here is about smaller than 90 nm, but the critical dimension may be further decreased as technology advances.

Besides, FIG. 4 also shows the situation where a shifting (or a mis-alignment) issue occurs between the RRAM structure 130 and the opening 106. As mentioned above, since both the width of the RRAM structure 130 and width of the opening 106 are equal to the critical dimension (CD), the sizes are very small, and the two elements are easily shifted from each other when a mis-alignment issue happens. As shown in FIG. 4, there is a horizontal offset D between the sidewall of the RRAM structure 130 and the opening 106. The horizontal offset D is about 10-20 nanometers, but not limited thereto. In addition, the first spacer 108 may also be exposed. It is noteworthy that, the second etching process E2 mentioned above may include a gas etching process with chlorine gas ($Cl_2$), since the chlorine gas is easy to react with copper, so when the shifting issue is occurred, the first spacer 108 can protect the contact structure 102 disposed underneath, thereby avoiding the damaging of the contact structure 102 caused by the etching process.

Figure 5:
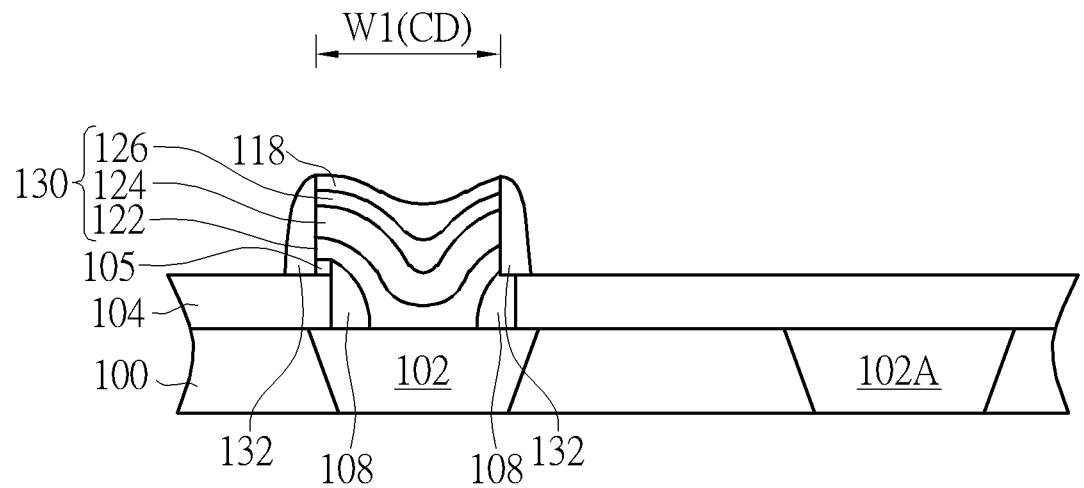

Afterwards, as shown in FIG. 5, two second spacers 132 are respectively formed on two sides of the RRAM structure 130. When viewed in a top view, the first spacer surrounds the opening 106, and the second spacer surrounds the RRAM structure 130. Besides, when viewed in a cross section diagram (FIG. 5), the second spacer 132 disposed on right side directly contacts the exposed first spacer 108, and the remained hard mask 105 is disposed between the left second spacer 132, the bottom electrode layer 112 and the first spacer 108. The second spacer 132 such as includes silicon nitride, but not limited thereto.

Figure 6:
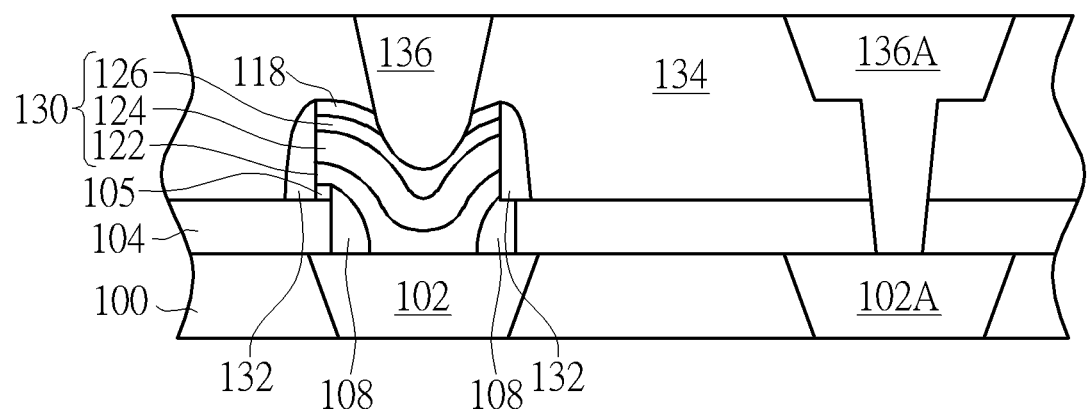

As shown in FIG. 6, a dielectric layer 134 and at least one the contact structure 136 disposed in the dielectric layer 134 are formed. The contact structure 136 is electrically connected to the RRAM structure 130. After this step, the connecting of the RRAM structure 130 and other components is completed. For example, other components can electrically connect to the RRAM structure 130 through the contact structure 102 or the contact structure 136. In addition, the semiconductor device may further comprise other contact structures (such as a contact structure 136A shown in FIG. 6) electrically connected to the contact structure 102A, and it should also be within the scope of the present invention.

Figure 7:
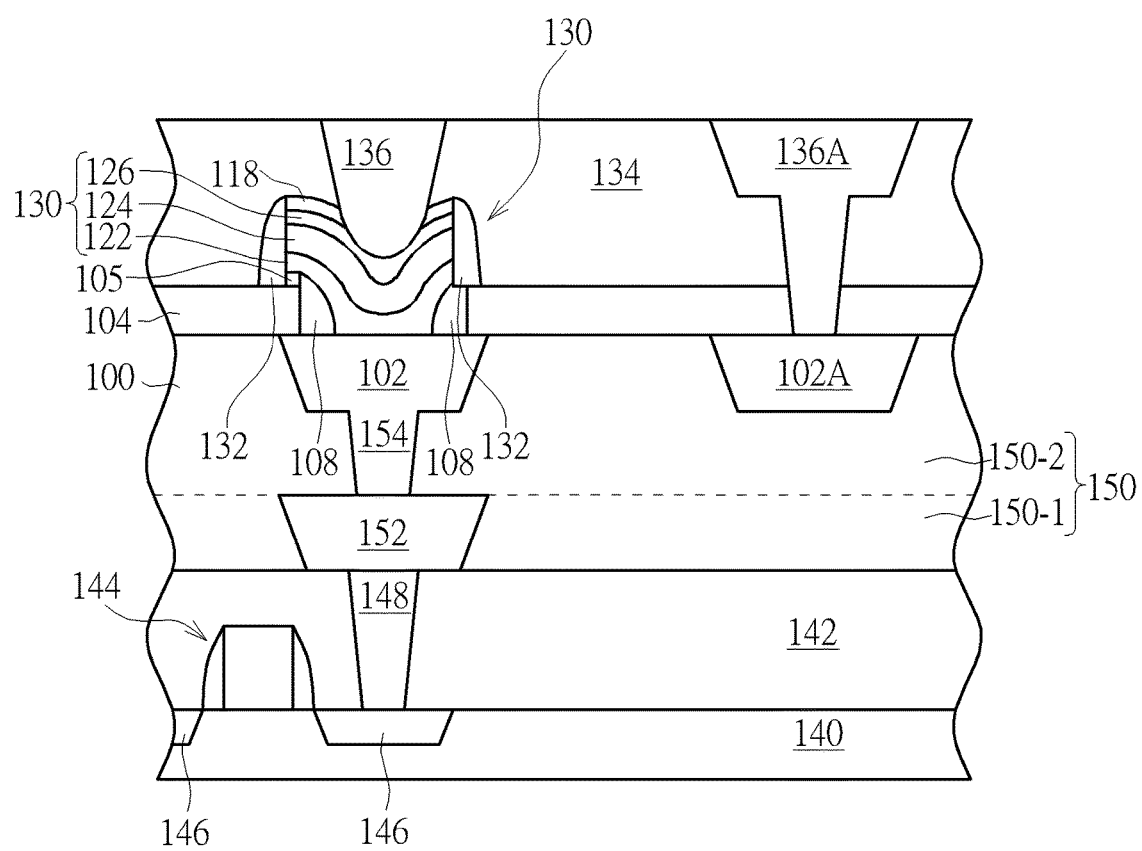

FIG. 7 shows a semiconductor device having the RRAM structure 130 of the present invention connecting with a transistor. The semiconductor device includes a substrate 140, a dielectric layer 142 disposed on the substrate 140, a transistor 144 disposed in the dielectric layer 142, and two source/drain regions 146 disposed on two sides of the transistor 144 and in the substrate 140. A contact structure 148 such as a contact plug is electrically connected to the source/drain regions 146, and the contact structure 148 is also electrically connected to the contact structure 102 mentioned above. There may further comprise other dielectric layers or other interconnects between the contact structure 148 and the contact structure 102. As shown in FIG. 7, the dielectric layer 150 (the dielectric layer 150 includes a dielectric layer 150-1 and a dielectric layer 150-2), an interconnect 152 and an interconnect 154 are disposed between the contact structure 148 and the contact structure 102. The interconnect 154 and the contact structure 102 may be two parts of one interconnect structure (such as a copper damascene structure) respectively. Besides, the interconnect 152 and the interconnect 154 are respectively disposed in the dielectric layer 150-1 and in the dielectric layer 150-2. In most embodiments, the semiconductor device of the present invention is a memory device, such as a 1T1R RRAM device. In other words, each one transistor corresponds to one RRAM, but not limited thereto.

The following description will detail the different embodiments of the semiconductor device and the manufacturing method of the present invention. To simplify the description, the following description will detail the dissimilarities among the different embodiments and the identical features will not be redundantly described. In order to compare the differences between the embodiments easily, the identical components in each of the following embodiments are marked with identical symbols.

Figure 8:
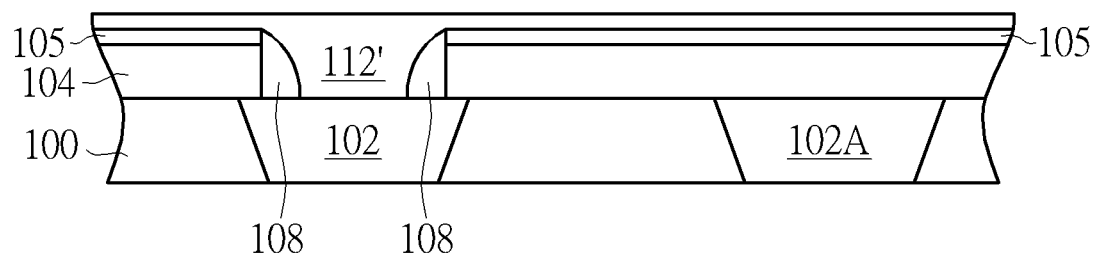
FIG. 8 shows the schematic diagram of the semiconductor structure according to another embodiment of the present invention.
Figure 9:
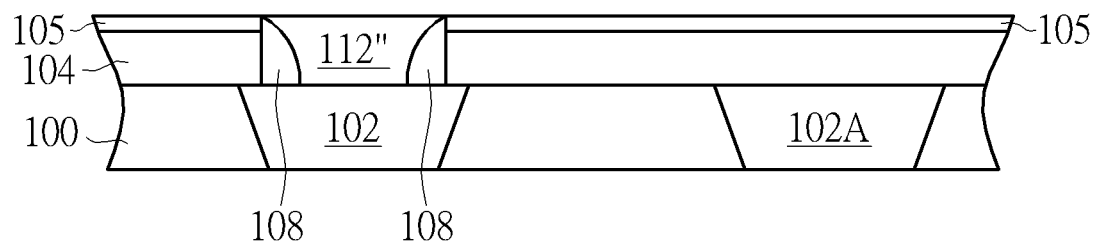
FIG. 9 shows the schematic diagram of the semiconductor structure according to another embodiment of the present invention.
Figure 10:
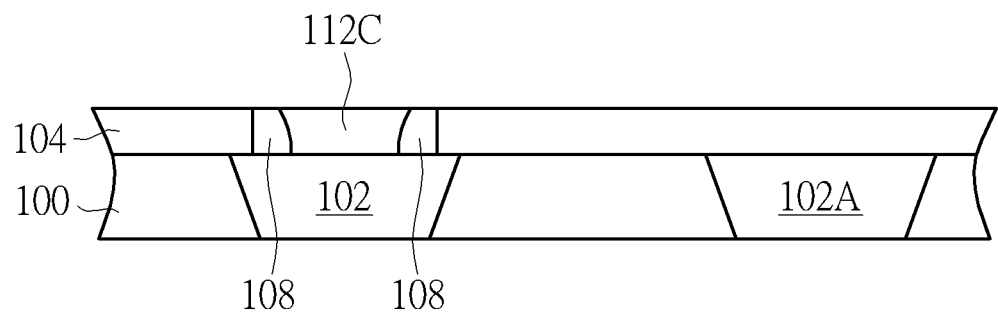
FIG. 10 shows the schematic diagram of the semiconductor structure according to another embodiment of the present invention.

Please refer to FIG. 8, FIG. 9 and FIG. 10, which show the semiconductor devices according to three different embodiments of the present invention respectively. In one embodiment, after the opening 106 is formed on the IMD 100, and the first spacers 108 are formed in the opening 106 (please refer to FIG. 2), the bottom electrode layer fills up the opening 106, and a planarization process is performed to remove extra bottom electrode layer. As shown in FIG. 8, a bottom electrode layer 112' fills up the opening 106, and after the planarization process (such as a CMP process) is performed, there are still parts of the bottom electrode layer 112' disposed on the hard mask 105 (or on the etching stop layer 104). Or in another case, as shown in FIG. 9, a bottom electrode layer 112" is filled in the opening 106, and after the planarization process is performed, the bottom electrode layer 112" is only disposed in the opening 106, but not disposed on the hard mask 105 (or on the etching stop layer 104). It is noteworthy that whether in FIG. 8 or in FIG. 9, a top surface of the bottom electrode layer 112', a top surface of the bottom electrode layer 112", and a top surface of the first spacer 108 are higher than a top surface of the etching stop layer 104.

In another embodiment of the present invention, please refer to FIG. 10, which shows the schematic diagram of the semiconductor device according to another embodiment of the present invention. Similar to the structure shown in FIG. 8 or FIG. 9, but in this embodiment, a bottom electrode layer 112C is filled in the opening 106, and after the planarization process, the hard mask 105 is entirely removed, and parts of the first spacer 108 are also removed. Therefore, each first spacer 108 has a truncated top surface. Besides, a top surface of the bottom electrode layer 112C, a top surface of the first spacer 108, and a top surface of the etching stop layer 104 are on a same level.

Figure 11:
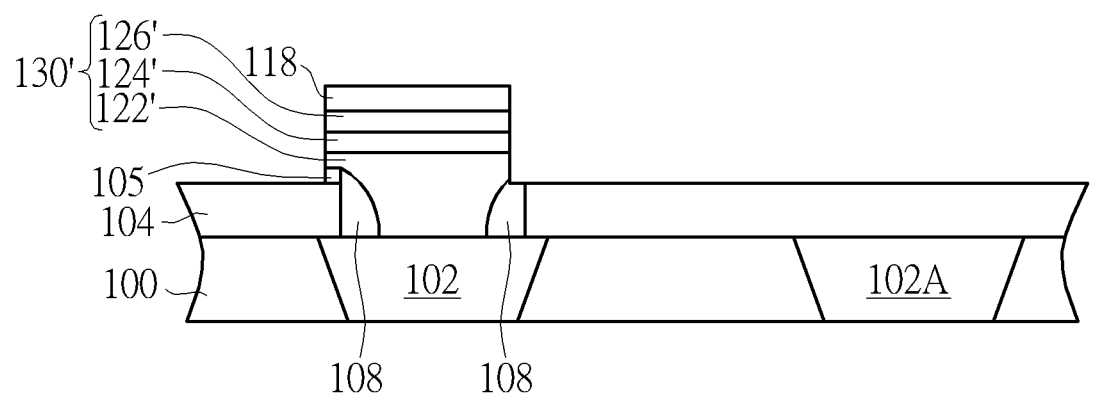
FIG. 11 shows the schematic diagram of the semiconductor device after a RRAM structure is formed based on the structure of FIG. 8.

Based on the structure shown in FIG. 8, the following steps are performed: forming the switching resistance layer and the top electrode layer sequentially, and performing the etching process to form a RRAM structure 130'. Next, the second spacers 132 and the dielectric layer 134 are formed, as shown in FIG. 11. The material of the RRAM structure 130' is same as the material of the RRAM structure 130 mentioned in the first preferred embodiment, and at least includes a bottom electrode 122', a switching resistance layer 124' and a top electrode 126'. However, the RRAM structure 130' has a flat top surface. Furthermore, all of the bottom electrode 122', the switching resistance layer 124', and the top electrode 126' have a flat top surface respectively. Besides, the bottom electrode 122' has two concave sidewalls. It should also be within the scope of the present invention. Except for the feature mentioned above, the other components, material properties, and manufacturing method of this embodiment are similar to the first preferred embodiment detailed above and will not be redundantly described. Similarly, the RRAM structure can also be formed based on the structure shown in FIG. 9 or FIG. 10. It should also be within the scope of the present invention.

The feature of the present invention is that the width of the RRAM and the width of the opening which are disposed on the opening are equal to the critical dimension. Therefore, the size of the device can be shrunk as much as possible. Besides, the size of the opening is further decreased since the spacers are formed in the opening, and the spacers also protect the contact structure from damages by the etching process, so as to improve the yield.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a contact structure, disposed in a first dielectric layer;
   a second dielectric layer, disposed on the first dielectric layer, and the second dielectric layer comprising an opening;
   a first spacer disposed in the opening and partially covering the contact structure; and
   a resistive random-access memory (RRAM) at least disposed on the contact structure, and directly contacting the first spacer, wherein the RRAM comprises a bottom electrode, a top electrode and a switching resistance layer disposed between the bottom electrode and the top electrode, wherein the RRAM is partially disposed in the opening, and the RRAM has a concave top surface.

2. The semiconductor device of claim 1, wherein the bottom electrode comprise titanium (Ti), titanium nitride (TiN), tantalum (Ta), tantalum nitride (TaN), tungsten (W), tungsten nitride (WN), platinum (Pt), gold (Au), copper (Cu), aluminum copper (AlCu), or a combination thereof.

3. The semiconductor device of claim 1, wherein the switching resistance layer comprises titanium oxide (TiO), nickel oxide (NiO), tungsten oxide ($WO_3$), zirconium oxide (ZrO), copper oxide (CuO), hafnium oxide (HfO), tantalum oxide (TaO), zinc oxide (ZnO), alumina ($Al_2O_3$), and molybdenum oxide (MoO).

4. The semiconductor device of claim 1, wherein a width of the RRAM is equal to a width of the opening.

5. The semiconductor device of claim 4, wherein the width of the RRAM is equal to or smaller than 90 nanometers.

6. The semiconductor device of claim 1, further comprising at least one second spacer disposed on the second dielectric layer, the second spacer directly contacting a sidewall of the RRAM.

7. The semiconductor device of claim 6, wherein the second spacer further directly contacts the first spacer.

8. The semiconductor device of claim 1, further comprising a transistor, and the contact structure is electrically connected to a source/drain of the transistor.

9. The semiconductor device of claim 1, wherein the contact structure comprises copper.

10. A method for forming a semiconductor device, comprising:
    providing a contact structure in a first dielectric layer;
    forming a second dielectric layer on the first dielectric layer;
    performing a first etching process to form an opening in the second dielectric layer;
    forming a first spacer in the opening, the first spacer partially covering the contact structure; and
    forming a resistive random-access memory (RRAM) on the contact structure, the RRAM directly contacting the first spacer, wherein the RRAM is partially disposed in the opening, and the RRAM has a concave top surface.

11. The method of claim 10, wherein a method for forming the RRAM comprises:
    forming a bottom electrode material layer on the second dielectric layer, on the first spacer and on the contact structure;
    forming a switching resistance material layer on the bottom electrode material layer;
    forming a top electrode material layer on the switching resistance material layer; and
    performing a second etching process to remove parts of the bottom electrode material layer, parts of the switching resistance material layer and parts of the top electrode material layer.

12. The method of claim 11, wherein the second etching process is a gas etching process with chlorine gas.

13. The method of claim 11, after performing the second etching process, parts of the first spacer is exposed.

14. The method of claim 10, wherein the switching resistance layer comprises titanium oxide (TiO), nickel oxide (NiO), tungsten oxide ($WO_3$), zirconium oxide (ZrO), copper oxide (CuO), hafnium oxide (HfO), tantalum oxide (TaO), zinc oxide (ZnO), alumina ($Al_2O_3$), and molybdenum oxide (MoO).

15. The method of claim 10, wherein a width of the RRAM is equal to a width of the opening.

16. The method of claim 15, wherein the width of the RRAM is equal to or smaller than 90 nanometers.

17. The method of claim 10, further comprising forming at least one second spacer disposed on the second dielectric layer, the second spacer directly contacting a sidewall of the RRAM.

18. The method of claim 17, wherein the second spacer further directly contacts the first spacer.

* * * * *